US009812421B2

(12) United States Patent
Uno et al.

(10) Patent No.: US 9,812,421 B2
(45) Date of Patent: Nov. 7, 2017

(54) BONDING WIRE FOR SEMICONDUCTOR DEVICES

(71) Applicants: NIPPON STEEL & SUMIKIN MATERIALS CO., LTD., Tokyo (JP); NIPPON MICROMETAL CORPORATION, Saitama (JP)

(72) Inventors: Tomohiro Uno, Tokyo (JP); Yoshiaki Hagiwara, Tokyo (JP); Tetsuya Oyamada, Tokyo (JP); Daizo Oda, Saitama (JP)

(73) Assignees: NIPPON STEEL & SUMIKIN MATERIALS CO., LTD., Tokyo (JP); NIPPON MICROMETAL CORPORATION, Saitama (JP)

( * ) Notice: Subject to any disclaimer, the term of this patent is extended or adjusted under 35 U.S.C. 154(b) by 0 days.

(21) Appl. No.: 15/105,707

(22) PCT Filed: Dec. 4, 2014

(86) PCT No.: PCT/JP2014/082164

§ 371 (c)(1),
(2) Date: Jun. 17, 2016

(87) PCT Pub. No.: WO2015/093306

PCT Pub. Date: Jun. 25, 2015

(65) Prior Publication Data

US 2016/0315063 A1 Oct. 27, 2016

(30) Foreign Application Priority Data

Dec. 17, 2013 (JP) ................................ 2013-260563

(51) Int. Cl.
*H01L 23/48* (2006.01)
*H01L 23/00* (2006.01)
(Continued)

(52) U.S. Cl.
CPC ............ *H01L 24/45* (2013.01); *B23K 35/302* (2013.01); *B23K 35/3006* (2013.01);
(Continued)

(58) Field of Classification Search
CPC ..... H01L 24/45; H01L 24/48; H01L 2224/44; H01L 2924/01327
(Continued)

(56) References Cited

U.S. PATENT DOCUMENTS 6,727,579 B1 * 4/2004 Eldridge .................. H05K 3/24 257/692
6,778,404 B1 * 8/2004 Bolken ................. H01L 25/105 257/E25.023
(Continued)

FOREIGN PATENT DOCUMENTS

JP 2010-212697 A 9/2010
JP 2013-232693 A 11/2013
WO 02/23618 A1 3/2002

OTHER PUBLICATIONS

International Search Report dated Mar. 3, 2015, issued in International Application No. PCT/JP2014/082164 (w/English translation).

*Primary Examiner* — Nitin Parekh
(74) *Attorney, Agent, or Firm* — McDermott Will & Emery LLP

(57) ABSTRACT

Provided is a bonding wire capable of reducing the occurrence of defective loops. The bonding wire includes: a core material which contains more than 50 mol % of a metal M; an intermediate layer which is formed over the surface of the core material and made of Ni, Pd, the metal M, and unavoidable impurities, and in which the concentration of the Ni is 15 to 80 mol %; and a coating layer formed over the intermediate layer and made of Ni, Pd and unavoidable impurities. The concentration of the Pd in the coating layer is 50 to 100 mol %. The metal M is Cu or Ag, and the
(Continued)

10
12
16
14 concentration of Ni in the coating layer is lower than the concentration of Ni in the intermediate layer.

9 Claims, 1 Drawing Sheet

(51) Int. Cl.

| | |
|---|---|
| ***C22C 5/06*** | (2006.01) |
| ***C22C 5/08*** | (2006.01) |
| ***C22C 9/06*** | (2006.01) |
| ***B23K 35/30*** | (2006.01) |
| ***B23K 35/32*** | (2006.01) |

(52) U.S. Cl.
CPC ........ *B23K 35/3033* (2013.01); *B23K 35/322* (2013.01); *C22C 5/06* (2013.01); *C22C 5/08* (2013.01); *C22C 9/06* (2013.01); *H01L 24/43* (2013.01); *H01L 24/48* (2013.01); *H01L 2224/05624* (2013.01); *H01L 2224/43* (2013.01); *H01L 2224/4321* (2013.01); *H01L 2224/43848* (2013.01); *H01L 2224/45005* (2013.01); *H01L 2224/45015* (2013.01); *H01L 2224/45032* (2013.01); *H01L 2224/45101* (2013.01); *H01L 2224/45139* (2013.01); *H01L 2224/45147* (2013.01); *H01L 2224/45155* (2013.01); *H01L 2224/45163* (2013.01); *H01L 2224/45164* (2013.01); *H01L 2224/45166* (2013.01); *H01L 2224/45541* (2013.01); *H01L 2224/45572* (2013.01); *H01L 2224/45644* (2013.01); *H01L 2224/45655* (2013.01); *H01L 2224/45664* (2013.01); *H01L 2224/4809* (2013.01); *H01L 2224/48247* (2013.01); *H01L 2224/48465* (2013.01); *H01L 2224/85444* (2013.01); *H01L 2924/00011* (2013.01); *H01L 2924/013* (2013.01); *H01L 2924/01005* (2013.01); *H01L 2924/01015* (2013.01); *H01L 2924/10253* (2013.01); *H01L 2924/206* (2013.01); *H01L 2924/386* (2013.01)

(58) Field of Classification Search
USPC .......................................................... 257/784
See application file for complete search history.

(56) References Cited

U.S. PATENT DOCUMENTS

| | | | | |
|---|---|---|---|---|
| 8,940,403 | B2 * | 1/2015 | Lee | C22F 1/14 148/430 |
| 2001/0009724 | A1 * | 7/2001 | Chen | B23K 20/004 428/607 |
| 2003/0173659 | A1 * | 9/2003 | Lee | H01L 24/03 257/690 |
| 2004/0014266 | A1 | 1/2004 | Uno et al. | |
| 2004/0245320 | A1 * | 12/2004 | Fukagaya | H01L 24/43 228/110.1 |
| 2006/0186544 | A1 * | 8/2006 | Won | H01L 24/45 257/741 |
| 2010/0239456 | A1 * | 9/2010 | Lee | B21C 1/003 420/505 |
| 2013/0126934 | A1 * | 5/2013 | Chung | H01L 33/62 257/99 |
| 2013/0164169 | A1 * | 6/2013 | Lee | B21C 37/047 420/505 |
| 2013/0233594 | A1 * | 9/2013 | Lee | H01L 24/43 174/126.2 |
| 2014/0209215 | A1 * | 7/2014 | Chuang | H01L 24/45 148/518 |

* cited by examiner

BONDING WIRE FOR SEMICONDUCTOR DEVICES

CROSS-REFERENCE TO RELATED APPLICATIONS

This application is the U.S. National Phase of PCT/JP2014/082164 filed Dec. 4, 2014, which claims priority to Japanese Patent Application No. 2013-260563 filed Dec. 17, 2013. The subject matter of each is incorporated herein by reference in entirety.

TECHNICAL FIELD

The present invention relates to a bonding wire for semiconductor devices which is used for connecting an electrode on a semiconductor element to wiring of a circuit wiring board (a lead frame, a substrate, a tape, or the like).

BACKGROUND ART

Currently, as a bonding wire for semiconductor devices (hereinafter referred to as bonding wire) which connects between an electrode on a semiconductor element and an external terminal, a thin wire (bonding wire) having a wire diameter of about 20 to 50 μm is mainly used. The bonding wire is generally bonded by using an ultrasonic and thermo-compression bonding method. This method uses a general-purpose bonding device, a capillary jig connecting a bonding wire by passing the bonding wire therethrough, or the like. In order to connect the bonding wire, a tip of the wire is first heated and melted by generating arc discharge, so that a ball portion is formed by surface tension. Thereafter, the ball portion is press-bonded (ball-bonded) onto the electrode of the semiconductor element heated in a range of 150 to 300° C. Then, the wire is directly bonded (wedge-bonded) to the side of the external lead by ultrasonic compression bonding.

In recent years, the structure, material, connection technique, and the like, of semiconductor mounting have been rapidly diversified. For example, in the mounting structure, in addition to the QFP (Quad Flat Packaging) using current lead frames, new forms, such as the BGA (Ball Grid Array) and the CSP (Chip Scale Packaging) which use a substrate, a polyimide tape, and the like, are put to practical use, and a bonding wire in which loop characteristics, bonding characteristics, mass production usability, and the like are further improved is desired.

As the material of the bonding wire, high purity 4N gold (purity >99.99 mass %) has been mainly used. However, since gold is expensive, a bonding wire, which is made of other metal at inexpensive material cost, is desired.

As a bonding wire of inexpensive material cost and excellent electrical conductivity, Patent Literature 1 discloses a bonding wire which has a core material made of copper as a main component, and an outer layer provided on the core material and containing copper and a metal M different from the core material in either or both of components and composition.

CITATION LIST

Patent Literature

Patent Literature 1: Japanese Patent Laid-Open No. 2010-212697

SUMMARY OF INVENTION

Technical Problem

However, in the case of Patent Literature 1 described above, there may be a problem that, when a loop is formed, the bonding wire is deformed due to differences in strain and resistance to deformation (deformation resistance) between the core material and the outer layer, and thereby a defective loop occurs.

Therefore, an object of the present invention is to provide a bonding wire capable of reducing occurrence of the defective loop.

Solution to Problem

A bonding wire according to a first aspect of the present invention includes: a core material which contains more than 50 mol % of a metal M; an intermediate layer which is formed over the surface of the core material and made of Ni, Pd, the metal M, and unavoidable impurities and in which the concentration of the Ni is 15 to 80 mol %; and a coating layer which is formed over the intermediate layer and made of Ni, Pd and unavoidable impurities and in which the concentration of Pd is 50 to 100 mol %, and the metal M is Cu or Ag, and the concentration of Ni in the coating layer is lower than the concentration of Ni in the intermediate layer.

Further, in the bonding wire according to another aspect of the present invention, the coating layer further contains Au, and the bonding wire further includes a surface layer which is formed over the coating layer and is made of an alloy containing Au and Pd and in which the concentration of the Au is 10 to 70 mol % and the sum total concentration of the Au and the Pd is 80 mol % or more, and the concentration of Au in the coating layer is lower than the concentration of Au in the surface layer.

Advantageous Effects of Invention

According to the first aspect of the present invention, the intermediate layer can absorb the difference in resistance to deformation (deformation resistance) between the core material and the coating layer, to thereby reduce the occurrence of the snake loop as a defective loop.

According to another aspect of the present invention, the surface layer reduces the sliding resistance by inhibiting (suppressing) sulfuration and oxidation on the wire surface, and thereby can reduce the occurrence of the sagging loop as a defective loop in addition to the snake loop.

BRIEF DESCRIPTION OF DRAWING

FIGS. 1A and 1B are schematic views showing forms of defects caused by unusual deformation of a bonding wire, in which FIG. 1A is a view showing a snake loop defect, and FIG. 1B is a view showing a sagging loop defect.

DESCRIPTION OF EMBODIMENTS

1. Embodiment (Overall Configuration)

In the following, an embodiment of the present invention will be described in detail. A bonding wire according to the present embodiment includes: a core material containing more than 50 mol % of a metal M; an intermediate layer formed over the core material; and a coating layer formed over the intermediate layer. The metal M is Cu or Ag.

The intermediate layer is made of Ni, Pd, the metal M, and unavoidable (incidental) impurities, and the concentration of the Ni is 15 to 80 mol %. The coating layer is made of Ni, Pd, and the unavoidable impurities, and the concentration of the Pd is 50 to 100 mol %. The concentration of Ni in the coating layer is lower than the concentration of Ni in the intermediate layer. It should be noted that the concentration in this specification is expressed in mol %, and represents a maximum concentration in each of the layers except for the core material, in a case where the concentration is measured in the depth direction of each of the layers with the use of AES (Auger Electron Spectroscopy).

Between Cu or Ag constituting the core material and Pd contained in the coating layer, there are a two-fold or greater difference in strength and a difference of 400° C. or more in recrystallization temperature. On the other hand, the strength of Ni takes a value roughly in the middle between that of Cu or Ag and that of Pd, and the recrystallization temperature of Ni takes a value roughly in the middle between that of Cu or Ag and that of Pd. In the case of the present embodiment, the intermediate layer is an alloy which contains Ni and Pd, and Cu or Ag, and which has concentration of Ni of 15 to 80 mol % and hence contains more Ni than the coating layer. Therefore, each of strength and recrystallization temperature of the intermediate layer takes a value roughly in the middle between the value of the core material and the value of the coating layer. Thereby, in the bonding wire, the intermediate layer absorbs the difference in resistance to deformation (deformation resistance) between the core material and the coating layer, and thus the occurrence of the defective loop can be reduced.

Figure 1A:
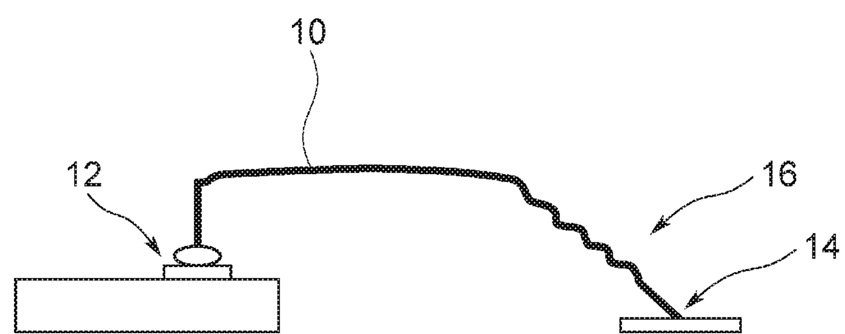

The defective loop will be described with reference to FIG. 1A. A bonding wire 10 shown in FIG. 1A is bonded by ball bonding 12 and wedge bonding 14, and formed with a snake loop 16, which is a defective loop. The snake loop 16 has a shape such that the bonding wire 10 is bent a plurality of times in a downward region close to the wedge bonding 14. The snake loop 16 more frequently occurs in a trapezoidal loop in which the height difference between the ball bonding 12 and the wedge bonding 14 is large and the span length between the ball bonding 12 and the wedge bonding 14 is long. For example, the snake loop 16 frequently occurs in the case where the height difference between the ball bonding 12 and the wedge bonding 14 is 500 μm or more and the length (span length) between the ball bonding 12 and the wedge bonding 14 is 3 mm or more and the length of the downward region is 800 μm.

The intermediate layer has concentration of 15 to 80 mol % of Ni and hence can surely absorb the difference in the deformation resistance between the core material and the coating layer. When the concentration of Ni in the intermediate layer is more than 80 mol %, voids are generated in the ball portion.

When the ball portion in which the voids are generated is bonded on the electrode, it causes deformation of the ball portion such as an eccentric deformation that the ball portion is deformed, an oval deformation which is a shape defect that the shape is deviating from a true circle, a flower-shaped deformation, or the like, resulting in problems such as protrusion of the bonding portion from the electrode area, lowering of the bonding strength, a chip damage, failure in production management, or the like. These defects of initial bonding may also induce reduction in the bonding reliability described below.

It is preferred that the intermediate layer has a thickness of 8 to 80 nm. In the bonding wire, the intermediate layer with the thickness of 8 to 80 nm can absorb the difference in the deformation resistance between the core material and the coating layer more reliably. In the case where the intermediate layer has a thickness of more than 80 nm, the diffusion rate in the bonding interface is low when the bonding wire is connected at a low temperature, so that the strength of the wedge bonding is reduced.

In present embodiment, even if the concentration of Ni is 15 mol % or more in a boundary region between the coating layer and the intermediate layer, this region is regarded as the coating layer in this specification, as long as the concentration of Pd is 50 mol % or more.

In the coating layer, when the concentration of Pd is 50 to 100 mol %, oxidization on the surface of the bonding wire can be further inhibited. Incidentally, when the surface of the bonding wire is oxidized, it is more likely that the strength of the wedge bonding is lowered and that the wire surface sealed with resin is corroded.

Further, the coating layer may also contain the metal M. In the bonding wire, containment of the metal M in the coating layer improves the effect of reducing the lip-like damage which is a problem that occurs in the vicinity of the boundary between the ball portion and the neck portion.

When the metal M is Cu, the core material may contain one or more elements selected from P, Ti, B and Ag. In this case, when the total concentration of the one or more elements selected from P, Ti, B and Ag is in the range of 0.0005 to 0.02 mass % of the total concentration of all elements contained in the wire, the circularity of the press-bonded ball can be improved. Incidentally, in recent years, narrow-pitch connection has been required in highest density mounting. For this reason, the deformed shape of the ball bonding portion is significant, and hence it is required to improve the circularity by inhibiting a flower-shaped deformation, an eccentric deformation, and the like.

Further, when the metal M is Cu, the core material may contain one or more elements selected from Pd and Ni. In this case, when the total concentration of the one or more elements selected from Pd and Ni is in the range of 0.2 to 2.0 mass % of the total concentration of all elements contained in the wire, the bonding reliability can be improved.

Incidentally, in the case where the wire is used at high temperature, such as in automotive semiconductors and the like, there often arises problems concerning the bonding reliability at the bonding portion between the bonding wire and the electrode. The bonding reliability is checked by evaluating the decrease in strength of the bonding portion, the increase in the electrical resistance, and the like, with an accelerated test such as a high-temperature heating test.

When the metal M is Ag, the core material may contain one or more elements selected from Pd, Ni and Cu. In this case, the bonding reliability can be improved when the total concentration of the one or more elements selected from Pd, Ni, and Cu is within the range of 0.5 to 5.0 mass % of the total concentration of all elements contained in the wire.

Further, the bonding wire according to the present embodiment may be provided with a surface layer which is made of an alloy containing Au and Pd and formed over the coating layer. In this case, the coating layer further contains Au. Also, the coating layer may contain a small amount of Ni or Cu.

In the surface layer, the concentration of Au is 10 to 70 mol %, and the sum-total concentration of Au and Pd is 80 mol % or more. Even if the concentration of Pd is 50 mol % or more in the boundary region between the surface layer and the coating layer, this region is regarded as the surface layer in this specification, as long as the concentration of Au is 10 mol % or more.

Figure 1B:
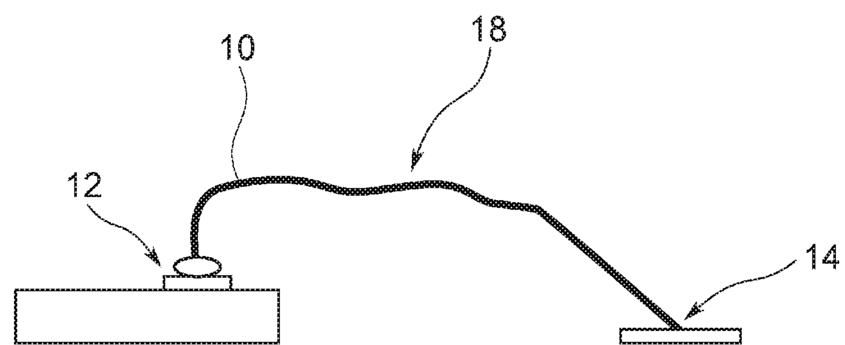

The surface layer made of the alloy containing Au and Pd can inhibit (suppress) sulfuration and oxidation of the wire surface to thereby reduce sliding resistance. Therefore, the bonding wire provided with the surface layer can reduce the occurrence of the sagging loop 18 shown in FIG. 1B and the snake loop. Similar to the case of the snake loop 16, the sagging loop 18 frequently occurs in a trapezoidal loop in which the height difference between the ball bonding 12 and the wedge bonding 14 is large and the span between the ball bonding 12 and the wedge bonding 14 is long. The sagging loop 18 has a shape with more gradual curves than the snake loop 16.

In the surface layer, when the concentration of Au is 10 to 70 mol % and the sum-total concentration of Au and Pd is 80 mol % or more, the sliding resistance can be more surely reduced. In the surface layer, when the concentration of Au is more than 70 mol %, a defect that the ball portion is deformed into an oval shape occurs. Such oval ball portion is not suitable for high-density mounting, in which the ball bonding is performed on a small electrode.

It is preferred that the total thickness of the surface layer, the coating layer, and the intermediate layer is in the range of 25 to 200 nm. In this range, the bonding wire can suppress (inhibit) a peeling defect that is stripping off of the wedge bonding portion, and hence the bonding wire can improve the wedge bonding performance. It is more preferred that the total thickness of the surface layer, the coating layer, and the intermediate layer is in the range of 40 to 150 nm because the wedge bonding performance can be more surely improved.

It is preferred that the thickness of the surface layer is in the range of 3 to 30 nm. In this range, the bonding wire can more surely reduce the occurrence of the snake loop and the sagging loop.

(Manufacturing Method)

Next, the manufacturing method of the bonding wire according to the present embodiment will be described. The manufacture of the bonding wire requires: a process in which the intermediate layer, the coating layer, and, in some case, the surface layer are formed over the surface of the core material; a processing process in which the wire is processed to have a desired thickness; and a heat treatment process.

Examples of the methods for forming the intermediate layer, the coating layer, and the surface layer over the surface of the copper core material include a plating method, a vapor deposition method, a melting method, and the like. In the plating method, the layers can be manufactured by either of an electrolytic plating method or an electroless plating method. The electrolytic plating method, which is referred to as a strike plating method or a flash plating method, provides a fast plating rate and good adhesion to an underlayer. Solutions used for the electroless plating method are classified into a substitution type and a reduction type. When a film (layer) is thin, it is sufficient to perform the substitution type plating only. However, when a thick film is to be formed, it is effective to perform the reduction type plating after the substitution type plating in a stepwise manner. The electroless plating method uses a simple plating apparatus or the like and is easy, but requires longer time than the electrolytic plating method.

Examples of a vapor deposition method to be used include, a physical adsorption method such as a sputtering method, an ion plating method, and a vacuum vapor deposition method, and a chemical adsorption method such as a plasma CVD method. Since each of these methods is a dry-type method, washing after film formation is not necessary, and hence there is no risk of surface contamination or the like during the washing.

In the step of performing the plating method or the vapor deposition method, either of a method in which a desired film is formed over a wire having a target diameter and a method in which, after a film is formed over a core material having a large diameter, the core material is drawn a plurality of times to achieve a target wire diameter is effective. The former method, in which the film is formed over the wire having the target diameter, is effective because manufacturing, quality management, and the like are simple. The latter method, in which the film forming step and the wire drawing step are combined, is effective for improving the adhesive property between the film and the core material. It is possible to use a method in which a film is formed over a copper wire having a target diameter by continuously running the wire in an electrolytic plating solution or a method in which, after a film is formed over a thick copper wire by immersing the wire in an electrolytic or electroless plating bath, the wire is drawn to achieve a final wire diameter. These are specific examples of the respective methods.

In the processing process after forming the intermediate layer, the coating layer, and the surface layer, a roll-rolling process, a swaging process, a die drawing process, or the like is selectively used according to the purpose. Controlling the processed structure, the dislocation, a defect at the crystal grain boundary, and the like according to the processing speed, a pressurization rate, a die area reduction rate, or the like, affects the structure, the adhesive property, and the like of the intermediate layer, the coating layer, and the surface layer.

The heat treatment process promotes mutual diffusion between the metal elements contained in each layer at each of the interface between the core material and the intermediate layer, the interface between the intermediate layer and the coating layer, and the interface between the coating layer and the surface layer. It is effective to carry out the heat treatment one or more times according to the purpose. In order to obtain desired film thickness and desired composition in each of the intermediate layer, the coating layer, and the surface layer, there is required a manufacturing technique in which the concentration of % order, the film thickness of nm order, and the like, are controlled with strict accuracy. The heat treatment process is classified into an annealing process immediately after the film forming process, an annealing process in the middle of the processing process, and a finishing annealing process for obtaining the final diameter, and it is important that these processes are selectively used.

When the wire is simply heated, the distribution of each of the metal elements in the surface and in the inside of the bonding wire cannot be controlled. When a stress-relief annealing process, which is used in a conventional wire manufacturing method, for obtaining the final wire diameter is used, the loop control becomes unstable due to decrease in the adhesive properties among the core material, the intermediate layer, the coating layer, and the surface layer. In addition, it is difficult to control the homogeneity in each of the layers in the wire longitudinal direction and to control the distribution of each of the layers in the wire cross section. For these reasons, it is important to control the timing, temperature, speed, time, and the like, of the heat treatment.

Controlling the progress of the diffusion by combining the processing and the heat treatment makes it possible to desirably control the film thickness, the composition, and the structure. The processing history before the heat treatment affects the structure of each of the interface between the core material and the intermediate layer, the interface between the intermediate layer and the coating layer, and the interface between the coating layer and the surface layer, and hence also affects the diffusion behavior in the heat treatment. The composition, the thickness, and the like, of each of the layers of the final product are changed depending on at which stage of the processing the heat treatment is performed.

In the heat treatment method, the heat treatment is performed while the wire is continuously running, and further, a temperature gradient is established in the furnace, instead of setting the furnace temperature constant as in the general heat treatment. Thereby, it is possible to easily mass-produce the bonding wire which has the core material, the intermediate layer, the coating layer, and the surface layer, and which has the characteristics of the present embodiment. Specific examples of the heat treatment method include a method of locally introducing temperature gradients, a method of changing the temperature in the furnace, and the like. In order to inhibit oxidation of the surface of the bonding wire, it is effective that the heat treatment is performed while inert gas, such as $N_2$, Ar, or the like, is made to flow in the furnace.

In the method of establishing the temperature gradients, it is effective to establish a temperature gradient in two or more regions. For example, a positive temperature gradient is established (the temperature is increased in the running direction of the wire) in the vicinity of the furnace inlet and a negative temperature gradient is established (the temperature is reduced in the running direction of the wire) in the temperature stable region and in the vicinity of the furnace outlet. Thereby, the peeling or the like between the core material and each of the layers is prevented in the vicinity of the furnace inlet, so that the adhesive property can be improved. Also, the diffusion of each of the metal elements is promoted in the temperature stable region, so that the desired concentration gradient can be formed. Further, excessive oxidation of copper on the surface is inhibited in the vicinity of the furnace outlet, so that the bonding property, the loop controllability, and the like of the obtained bonding wire can be improved. In order to obtain these effects, it is desired that the temperature gradient at the inlet/outlet of the furnace is set to 10° C./cm or more.

In the method for changing the temperature, it is also effective that the inside of the furnace is divided into a plurality of regions and that temperature control is performed differently for each of the regions, to generate the distribution of temperature. For example, in the case where the inside of the furnace is divided into three or more regions and the temperature control is performed independently for each of the regions so that the temperature at each end of the furnace is lower than the temperature of the central portion of the furnace, it is possible to obtain the improvement effect similar to the case where the temperature gradient is formed. Further, when the outlet side of the furnace is set to a low temperature at which the oxidation rate of copper is low to inhibit oxidation of the surface of the bonding wire, it is possible to increase the bonding strength of the wedge bonding portion.

Further, in the melting method, either each of the layers or the core material is melted and casted. Each of the layers and the core material are bonded together to form a wire having a large diameter of 1 to 50 mm, and then the wire is drawn. Therefore, the melting method has advantages that the productivity is excellent, the component design of the alloy of each of the layers is easier than the plating method and the vapor deposition method, and the characteristics such as the strength and the bonding property are easily improved. In the specific process, there are a method in which each of the layers is formed by sequentially casting the melted metals that constitute the respective layers around the core material that is produced beforehand, and a method in which a hollow cylinder composed of the intermediate layer, the coating layer, and the surface layer, is produced beforehand and then the core material is formed by casting, for example, melted copper or a melted copper alloy, into the hollow portion. The latter method of casting the copper core material into the hollow cylinder is more preferred because the concentration gradient of copper and the like can be easily and stably formed in the intermediate layer and the coating layer. Further, in the melting method, the heat treatment work for diffusing copper in the intermediate layer and the coating layer can be omitted. However, the characteristics can be further improved by performing the heat treatment for adjusting the distribution of copper in the intermediate layer and the coating layer.

Further, when such molten metals are used, either of the core material and each of the layers can be produced by continuous casting. In this continuous casting method, as compared with the casting method described above, the process can be simplified and further the productivity can be improved by reducing the wire diameter.

Further, in the process of forming the coating layer containing no metal M, it is desired that the heat treatment temperature is low in order to inhibit the volume diffusion and the grain boundary diffusion of the metal M in the coating layer. Specifically, it is effective that the coating layer containing no metal M is formed by a process in which the heat treatment is performed two or more times so that the temperature of the intermediate heat treatment of the thick wire in the middle of the process is set high, and the temperature of the final heat treatment for obtaining the final wire diameter is set low. For example, it is desired that the diameter of the thick wire is at least twice as much as that of the final wire diameter, the wires being subjected to the two respective types of heat treatments, and that the difference between the high and low temperatures is 100° C. or more.

In the connection of the bonding wire according to the present embodiment, at the time of forming the ball portion, pure $N_2$ gas can be used as the shielding gas, in place of the standard gas of 5 vol % $H_2$+$N_2$. In the case where the ball portion is formed at the tip of the wire by generating arc discharge, when the shielding gas is blown to the molten ball portion, the arc discharge can be stabilized, and thereby oxidation of the surface of the ball portion can be inhibited.

2. Examples

Samples, contents of evaluation (evaluation contents), results of evaluation (evaluation results) will be described in order.

(Samples)

Raw materials of the bonding wire are as follows: Cu or Ag, being a high purity material having purity of about 99.99 mass % or more, was used in the core material; and plating liquids each having purity of 99.9 mass % or more were prepared for Pd in the coating layer, Ni in the intermediate layer, and Au in the surface layer, respectively. In the process of dissolving the core material, an appropriate amount of an alloy element was added.

A wire having a large diameter of about 1 to 3 mm was prepared, and the intermediate layer, the coating layer, the surface layer, and the like were formed over the surface of the wire by an electrolytic plating method. A commercially available plating liquid for electronic components and semiconductors was used.

In the case of the bonding wire including the core material, the intermediate layer, and the coating layer, two steps (stages) were performed in this order: the intermediate layer was formed by the Ni plating process, and then the coating layer was formed by the Pd plating process. Further, in the case where the bonding wire includes the core material, the intermediate layer, the coating layer, and the surface layer, three steps (stages) were performed in this order: the intermediate layer was formed by the Ni plating process, the coating layer was formed by the Pd plating process, and the surface layer was formed by the Au plating process. In order to improve the adhesiveness, heat treatment was performed as required, after the last plating process was performed. The batch heating was performed for 30 minutes at a low temperature of 150 to 300° C. in a nitrogen atmosphere. Further, heating treatment was performed as required, after the intermediate layer was formed. The heating condition was set in the above-described range.

After the intermediate layer, the coating layer, the surface layer, and the like were formed, the wire was drawn and thinned to a final wire diameter of 18 to 20 μm. The drawing speed was set in a range of 10 to 100 m/min, and the wire drawing dies each having the area reduction rate of 3 to 15% were used.

After the wire was drawn to have the final diameter, the wire was subjected to the final annealing process to remove the processing distortion so that the elongation value of the wire was in the range of 5 to 20%. As required, the wire was drawn by the dies to have a wire diameter of 30 to 100 μm, and then was subjected to intermediate annealing and further to a wire drawing process.

In the final annealing process or the intermediate annealing process of the wire, a continuous annealing process was used in which the wire was continuously heated while being run continuously. The temperature was set in a range of 300 to 700° C., and the wire running rate was adjusted in the range of 10 to 100 mm/min. The wire running rate or the like was optimized in accordance with the temperature distribution. In order to inhibit oxidization, nitrogen gas was used as ambient gas in the annealing atmosphere. The gas flow rate was set in the range of 0.0002 to 0.004 $m^3$/min. The intermediate annealing process performed in the middle of the wire drawing process was suitably combined with the final annealing performed at the final diameter. In the intermediate annealing process, the wire was annealed in the middle of the wire drawing process in the state where the wire diameter was in the range of 0.1 to 1 mm.

For connection of the bonding wire, a commercially available automatic wire bonder (made by K&S) was used to perform ball-wedge bonding. A ball portion was produced at the tip (one end) of the wire by arc discharge and the ball portion was bonded to an electrode film on a silicon substrate, and the other end of the wire was wedge-bonded on a lead terminal. In order to inhibit oxidation at the time of the ball melting, gas of 5 vol % $H_2$+$N_2$ was blown onto the tip of the wire. The bonding temperatures used were set to a usual temperature of 175° C. and a low temperature of 150° C. An aluminum electrode (Al-0.5% Cu film) on the silicon substrate was used as the electrode to be bonded and the thickness of the electrode was 0.8 μm. An Au/Pd electrode on the lead frame was used as the electrode to be wedge-bonded.

The depth analysis by AES was used for measuring the film thickness of the wire surface. The measurement was performed in the depth direction while Ag ion sputtering was performed, and the unit of depth was expressed in terms of $SiO_2$ conversion. For measuring the concentration of alloy elements in the bonding wire, AES or ICP (Inductively Coupled Plasma) analysis was used. When the element contained in the core material was the same as that contained in the intermediate layer, the coating layer, and the surface layer, which were formed over the wire surface, the average value of the concentration, measured in the cross section of the core material by an analytical method using EPMA (Electron Probe MicroAnalyser), EDX (Energy dispersive X-ray spectrometry), or AES, was used as the concentration of the element contained in the core material. The element in this example may be Pd, Ni or Au. On the other hand, when an element other than Pd, Ni and Au was contained in the core material and was different from the element contained in the intermediate layer, the coating layer, and the surface layer, the concentration measured by ICP analysis of the whole wire was used.

(Evaluation Contents)

In the evaluation of high-temperature reliability of the bonding portion, samples were resin-sealed after bonding and then were subjected to heat treatment under conditions of the treatment temperature of 185° C. and the treatment time of 2000 hours, and then electrical characteristics of each of 60 bonding wires (samples) were evaluated. The evaluation results are shown in the column of "high-temperature reliability" in Tables 1 and 2. Specifically, when the percentage of the bonding wires, each having electrical resistance increased 3 times or more than the initial value, is 30% or more, the bonding wires are determined as having defects in bonding and indicated by a cross mark. When the percentage of the bonding wires, each having electrical resistance increased 3 times or more than the initial value, is 5% or more and less than 30%, the bonding wires are determined to be acceptable for use in IC for which strict reliability is not required, and indicated by a triangle mark. When the percentage of the bonding wires, each having electrical resistance increased 3 times or more than the initial value, is less than 5% and when the percentage of the bonding wires, each having electrical resistance increased 1.5 times or more than the initial value, is 10% or more and less than 30%, the bonding wires are determined as having no practical problems and indicated by a single circle mark. When the percentage of the bonding wires, each having electrical resistance increased 1.5 times or more than the initial value, is less than 10%, the bonding wires are determined as being good and indicated by a double-circle mark.

In the evaluation of snake loop defects, two kinds of loops, a loop having a middle span height difference and a loop having a long span height difference, were evaluated. In the case of the middle span height difference, a trapezoidal loop was formed such that the wire length was 3.5 mm, the length of the downward region was 0.5 mm, and the height difference between the wedge bonding portion and the loop top position was 0.7 mm. In the case of the long span height difference, a trapezoidal loop was formed such that the wire length was 5 mm, the length of the downward region was 0.7 mm, and the height difference between the wedge bonding portion and the loop top position was 0.8 mm. The wire diameter was 20 μm. The frequency of occurrence of the defect (defect occurrence frequency) was evaluated for 500 loop connections by observing the downward region of the loop from above by using an optical microscope. When there are two or more bends in the downward region of one loop, the loop shape was determined to have a snake loop defect. The evaluation results are shown in the column of "snake loop" in Tables 1 and 2. Specifically, when the frequency of occurrence (occurrence frequency) is more than 10%, the loop shape is determined to be defective and indicated by the cross mark. When the occurrence frequency is more than 5% and not more than 10%, the loop shape is determined to be not suitable for mass production and indicated by the triangle mark. When the occurrence frequency is more than 2% and not more than 5%, the loop shape is determined to be relatively good and indicated by the single-circle mark. When the occurrence frequency is 0 to 2% or less, the loop shape is determined to be stable and indicated by the double-circle mark.

In the evaluation of sagging loop defects, a trapezoidal loop was formed such that the wire length was 5 mm, the length of the downward region was 1.5 mm, and the height difference between the wedge bonding portion and the loop top position was 0.7 mm. The wire diameter was 20 μm. The loop is observed from above by using the optical microscope and is determined to be a sagging loop defect in a case where the loop meanders with the long period of 0.2 mm or more. The defect occurrence frequency was evaluated for 400 loop connections. The evaluation results are shown in the column of "sagging loop" in Table 2. Specifically, when the occurrence frequency is more than 10%, the loop shape is determined to be defective and indicated by the cross mark. When the occurrence frequency is more than 5% and not more than 10%, the loop shape is determined to be not suitable for mass production and indicated by the triangle mark. When the occurrence frequency is more than 2% and not more than 5%, the loop shape is determined to be relatively good and indicated by the circle mark. When the occurrence frequency is 0 to 2% or less, the loop shape is determined to have no sagging loop defect and indicated by the double-circle mark.

A wedge bonding characteristic was evaluated by the occurrence frequency of peeling, which may occur when the bonding wire was bonded to the lead electrode. The bonding wires after manufacture were stored in a spool case at room temperature for 30 days in air in a clean room. Under the bonding conditions that the ultrasonic output was slightly reduced, and further the stage temperature was set to a low temperature of 160° C., so that wedge bonding failure were induced. The occurrence frequency of wedge bonding failure was evaluated for 1000 bonding wires. The evaluation results are shown in the column of "wedge bonding characteristic" in Tables 1 and 2. Specifically, when the number of exfoliation defects is 10 or more, it is determined that the wedge bonding characteristics need to be improved and are indicated by the cross mark. When the number of exfoliation defects is 4 to 9, the wedge bonding characteristic is determined to be indicated by the triangle mark. When the number of exfoliation defects is 1 to 3, the wedge bonding characteristic is determined to be good and indicated by the single-circle mark. When the number of exfoliation failures is zero, the wedge bonding characteristic is determined to be excellent and indicated by the double-circle mark.

The roundness of shape, defect of unusual deformation, dimension accuracy, and the like were evaluated by observing 200 bonded ball portions in the evaluation of the shape (the bonding shape) of a press-bonded ball portion. Under strict conditions that the wire diameter was 20 μm and the ratio of the initial ball diameter/the wire diameter was about 2, small ball bonding shapes were evaluated.

The evaluation results are shown in the column of "press-bonded ball shape" in Tables 1 and 2. Specifically, when the number of defective ball shapes such as an anisotropic shape deviated from a true circle, a shape having a flower-shaped deformation, and the like is 5 or more, the ball shapes are determined to be defective and indicated by the cross mark. The cases where the number of the defective ball shapes deviated from the true circle are 2 to 4, is classified into two types. In the case where one or more defects of unusual deformation occur, the ball shapes are desired to be improved in mass production and hence indicated by the triangle mark. In the case where there is no occurrence of defect of unusual deformation, the ball shapes are determined to be acceptable and indicated by the single-circle mark. Further, when the number of defective ball shapes is one or less, the ball shapes are determined to be excellent and indicated by the double-circle mark.

(Evaluation Results)

Each of the bonding wires in the examples 1 to 18 includes the core material, the intermediate layer, and the coating layer, and the concentration of Ni in the intermediate layer was 15 to 80 mol %, and hence it was confirmed that the occurrence of the snake loop defect could be reduced. On the other hand, in comparison examples 1, 2 and 5, in each of which the bonding wire did not contain the intermediate layer, or in comparison examples 3, 4 and 6, in which the concentration of Ni in the intermediate layer was outside the above-described range, the snake loop defect occurred at a high frequency.

In the examples 2 to 5, and the examples 7 to 18, it was confirmed that, when the thickness of the intermediate layer was 8 to 80 nm, the occurrence of the exfoliation defect in the wedge bonding could be reduced.

In the bonding wires of the examples 19 to 35, each bonding wire includes the core material, the intermediate layer, the coating layer, and the surface layer, and the concentration of Ni in the intermediate layer was 15 to 80 mol % and the concentration of Au in the surface layer was 10 to 70 mol %, and the sum total concentration of Au and Pd was 80 mol % or more. Hence it was confirmed that the occurrence of the snake loop defect and the sagging loop defect could be reduced. On the other hand, in comparison examples 7 and 9, each of which did not contain the intermediate layer, or in comparison examples 8 and 10, in each of which the concentration of Ni in the intermediate layer was outside the above-described range, the snake loop defect and the sagging loop defect occurred at a high frequency. Further, in comparison example 11, in which the concentration of Au in the surface layer was outside the above-described range, the occurrence of the snake loop defect could be reduced, but the sagging loop defect occurred.

In the bonding wires in the examples 19 to 21, and the examples 24 to 35, the total thickness of the surface layer, the coating layer, and the intermediate layer was 25 to 200 nm, and hence it was confirmed that the occurrence of the exfoliation defect in the wedge bonding could be reduced. Further, in the bonding wires in the examples 19 to 21, the examples 24 to 29, and the examples 31 to 35, the total thickness of the surface layer, the coating layer, and the intermediate layer was 40 to 150 nm, and hence it was confirmed that the occurrence of the exfoliation defect in the wedge bonding could be more surely reduced.

In the bonding wires in the examples 19 to 22 and the examples 25 to 35, the thickness of the surface layer was 3 to 30 nm, and hence it was confirmed that the occurrence of the snake loop defect and the sagging loop defect could be more surely reduced.

In the case of the bonding wires in the examples 3 and 4, the examples 6 to 9, the examples 20 and 21, and the examples 23 to 26, the core material contained the metal M which is Cu and contained one or more elements selected from P, Ti, B and Ag, and the total concentration of the one or more elements in the whole wire was in the range of 0.0005 to 0.02 mass %. Hence it was confirmed that the press-bonded ball shape was good.

In the case of the bonding wires in the examples 10 to 12 and the examples 27 to 29, the core material contained the metal M which is Cu, and contained one or more elements selected from Pd and Ni, and the total concentration of the one or more elements in the whole wire was in the range of 0.2 to 2.0 mass %. Hence it was confirmed that the reliability (high-temperature reliability) after the heat treatment was high.

In the case of the bonding wires in the examples 15 to 18 and the examples 32 to 35, the core material contained the metal M which is Ag, and contained one or more elements selected from Pd, Ni and Cu, and the total concentration of the elements in the whole wire was in the range of 0.5 to 5.0 mass %. Hence it was confirmed that the reliability after the heat treatment was high.

TABLE 1

| | | COATING LAYER | | | INTERMEDIATE LAYER | | | |
|---|---|---|---|---|---|---|---|---|
| | | ELEMENT | MAXIMUM CONCENTRATION OF Pd mol % | FILM THICKNESS/ nm | ELEMENT | MAXIMUM CONCENTRATION OF Ni mol % | FILM THICK-NESS/ nm | FILM THICKNESS (COATING LAYER + INTERMEDIATE LAYER)/nm |
| EXAMPLE | 1 | Pd, Ni, Cu | 75 | 15 | Ni, Pd, Cu | 26 | 5 | 20 |
| | 2 | Pd, Ni, Cu | 95 | 55 | Ni, Pd, Cu | 80 | 15 | 70 |
| | 3 | Pd, Ni, Cu | 85 | 35 | Ni, Pd, Cu | 40 | 20 | 55 |
| | 4 | Pd, Ni, Cu | 95 | 58 | Ni, Pd, Cu | 15 | 30 | 88 |
| | 5 | Pd, Ni | 100 | 120 | Ni, Pd, Cu | 30 | 80 | 200 |
| | 6 | Pd, Ni, Cu | 90 | 35 | Ni, Pd, Cu | 44 | 90 | 125 |
| | 7 | Pd, Ni, Cu | 90 | 40 | Ni, Pd, Cu | 40 | 30 | 70 |
| | 8 | Pd, Ni, Cu | 90 | 40 | Ni, Pd, Cu | 40 | 30 | 70 |
| | 9 | Pd, Ni | 100 | 30 | Ni, Pd, Cu | 60 | 22 | 52 |
| | 10 | Pd, Ni | 90 | 55 | Ni, Pd, Cu | 45 | 60 | 115 |
| | 11 | Pd, Ni, Cu | 100 | 40 | Ni, Pd, Cu | 40 | 30 | 70 |
| | 12 | Pd, Ni, Cu | 100 | 40 | Ni, Pd, Cu | 40 | 30 | 70 |
| | 13 | Pd, Ni | 100 | 20 | Ni, Pd, Ag | 70 | 10 | 30 |
| | 14 | Pd, Ni, Ag | 85 | 15 | Ni, Pd, Ag | 20 | 25 | 40 |
| | 15 | Pd, Ni | 100 | 50 | Ni, Pd, Ag | 40 | 30 | 80 |
| | 16 | Pd, Ni, Ag | 60 | 10 | Ni, Pd, Ag | 40 | 80 | 90 |
| | 17 | Pd, Ni, Ag | 95 | 20 | Ni, Pd, Ag | 50 | 25 | 45 |
| | 18 | Pd, Ni | 100 | 30 | Ni, Pd, Ag | 40 | 30 | 60 |
| COMPARISON EXAMPLE | 1 | Pd | 100 | 40 | — | — | — | 40 |
| | 2 | Pd, Cu | 100 | 80 | — | — | — | 80 |
| | 3 | Pd, Cu | 80 | 16 | Ni, Pd, Cu | 8 | 7 | 23 |
| | 4 | Pd, Cu | 100 | 40 | Ni, Pd, Cu | 85 | 60 | 100 |
| | 5 | Pd | 100 | 40 | — | — | — | 40 |
| | 6 | Pd, Cu | 100 | 20 | Ni, Pd, Ag | 8 | 7 | 27 |

| | | CORE MATERIAL | | HEAT | | | PRESS- | |
|---|---|---|---|---|---|---|---|---|
| | | MAIN COMPONENT | DOPANT ELEMENT mass % | TREATMENT TEMPERATURE ° c. | SNAKE LOOP | WEDGE BONDING CHARACTERISTIC | BONDED BALL SHAPE | HIGH-TEMPERATURE RELIABILITY |
| EXAMPLE | 1 | Cu | — | 300 | ○ | Δ | ○ | Δ |
| | 2 | Cu | — | 250 | ○ | ◎ | ○ | Δ |
| | 3 | Cu | P0.002 | 400 | ○ | ◎ | ◎ | Δ |
| | 4 | Cu | B0.0005 | 450 | ○ | ◎ | ◎ | Δ |
| | 5 | Cu | — | 400 | ○ | ○ | ○ | Δ |
| | 6 | Cu | Ag0.02 | 600 | ○ | ○ | ◎ | Δ |
| | 7 | Cu | Ti0.005 | 500 | ○ | ◎ | ◎ | Δ |
| | 8 | Cu | P0.005 | 500 | ○ | ◎ | ◎ | Δ |
| | 9 | Cu | B0.005 | 300 | ○ | ◎ | ◎ | Δ |
| | 10 | Cu | Pd0.5 | 550 | ○ | ◎ | ○ | ○ |
| | 11 | Cu | Ni0.2 | 450 | ○ | ◎ | ○ | ○ |
| | 12 | Cu | Pd0.3 Ni0.5 | 450 | ○ | ◎ | ○ | ○ |
| | 13 | Ag | — | 350 | ○ | ○ | ○ | Δ |
| | 14 | Ag | — | 450 | ○ | ◎ | ○ | Δ |
| | 15 | Ag | Cu2 | 300 | ○ | ◎ | ○ | ○ |
| | 16 | Ag | Ni 1.0 | 450 | ○ | ◎ | ○ | ○ |
| | 17 | Ag | Pd0.5 | 450 | ○ | ◎ | ○ | ○ |
| | 18 | Ag | Pd2, Cu1 | 450 | ○ | ◎ | ○ | ○ |
| COMPARISON EXAMPLE | 1 | Cu | — | 300 | X | Δ | Δ | X |
| | 2 | Cu | — | 300 | X | Δ | Δ | X |
| | 3 | Cu | — | 600 | X | Δ | Δ | X |
| | 4 | Cu | — | 400 | X | X | Δ | X |
| | 5 | Ag | — | 300 | X | X | Δ | X |
| | 6 | Ag | — | 550 | X | X | Δ | X |

TABLE 2

| | | SURFACE LAYER | | | COATING LAYER | | |
|---|---|---|---|---|---|---|---|
| | | MAXIMUM CONCENTRATION OF Au mol % | MAXIMUM CONCENTRATION OF SUM TOTAL OF Au, Pd mol % | FILM THICKNESS/nm | ELEMENT | MAXIMUM CONCENTRATION OF Pd mol % | THICKNESS HAVING 80 (mol) % OR MORE CONCENTRATION OF Pd/μm |
| EXAMPLE | 19 | 70 | 100 | 5 | Au, Pd, Ni, Cu | 95 | 55 |
| | 20 | 60 | 100 | 5 | Au, Pd, Ni, Cu | 85 | 35 |
| | 21 | 50 | 100 | 3 | Au, Pd, Ni, Cu | 95 | 57 |
| | 22 | 50 | 100 | 10 | Au, Pd, Ni | 100 | 120 |
| | 23 | 40 | 100 | 32 | Au, Pd, Ni | 90 | 35 |
| | 24 | 15 | 100 | 2 | Au, Pd, Ni, Cu | 90 | 40 |
| | 25 | 50 | 100 | 5 | Au, Pd, Ni, Cu | 90 | 40 |
| | 26 | 10 | 90 | 3 | Au, Pd, Ni, Cu | 100 | 30 |
| | 27 | 35 | 100 | 5 | Au, Pd, Ni | 90 | 55 |
| | 28 | 50 | 100 | 30 | Au, Pd, Ni, Cu | 100 | 40 |
| | 29 | 50 | 100 | 5 | Au, Pd, Ni, Cu | 100 | 40 |
| | 30 | 70 | 100 | 5 | Au, Pd, Ni, Ag | 100 | 20 |
| | 31 | 50 | 90 | 5 | Au, Pd, Ni | 85 | 15 |
| | 32 | 40 | 100 | 5 | Au, Pd, Ni, Ag | 100 | 50 |
| | 33 | 50 | 100 | 5 | Au, Pd, Ni | 60 | 10 |
| | 34 | 40 | 100 | 10 | Au, Pd, Ni, Ag | 95 | 20 |
| | 35 | 50 | 100 | 5 | Au, Pd, Ni | 100 | 30 |
| COMPARISON EXAMPLE | 7 | 50 | 100 | 5 | Au, Pd, Cu | 100 | 40 |
| | 8 | 45 | 100 | 6 | Au, Pd, Ni, Cu | 80 | 16 |
| | 9 | 60 | 100 | 5 | Au, Pd, Ag | 100 | 40 |
| | 10 | 50 | 100 | 4 | Au, Pd, Ni, Ag | 100 | 20 |
| | 11 | 8 | 80 | 5 | Au, Pd, Ni, Cu | 75 | 15 |

| | | INTERMEDIATE LAYER | | | FILM THICKNESS (SURFACE LAYER + COATING LAYER + INTERMEDIATE LAYER)/nm | CORE MATERIAL | | HEAT TREATMENT TEMPERATURE ° C. |
|---|---|---|---|---|---|---|---|---|
| | | ELEMENT | MAXIMUM CONCENTRATION OF Ni mol % | FILM THICKNESS/nm | | MAIN COMPONENT | DOPANT ELEMENT mass % | |
| EXAMPLE | 19 | Ni, Pd, Cu | 80 | 15 | 75 | Cu | — | 250 |
| | 20 | Ni, Pd, Cu | 40 | 20 | 60 | Cu | P0.002 | 400 |
| | 21 | Ni, Pd, Cu | 15 | 30 | 90 | Cu | B0.0005 | 450 |
| | 22 | Ni, Pd, Cu | 30 | 80 | 210 | Cu | — | 400 |
| | 23 | Ni, Pd, Cu | 44 | 90 | 157 | Cu | Ag0.02 | 600 |
| | 24 | Ni, Pd, Cu | 40 | 30 | 72 | Cu | Ti0.005 | 500 |
| | 25 | Ni, Pd, Cu | 40 | 30 | 75 | Cu | P0.005 | 500 |
| | 26 | Ni, Pd, Cu | 60 | 22 | 55 | Cu | B0.005 | 300 |
| | 27 | Ni, Pd, Cu | 45 | 60 | 120 | Cu | Pd0.5 | 550 |
| | 28 | Ni, Pd, Cu | 40 | 30 | 100 | Cu | Ni0.2 | 450 |
| | 29 | Ni, Pd, Cu | 40 | 30 | 75 | Cu | Pd 0.3 Ni0.5 | 450 |
| | 30 | Ni, Pd, Ag | 70 | 10 | 35 | Ag | — | 350 |
| | 31 | Ni, Pd, Ag | 20 | 25 | 45 | Ag | — | 450 |
| | 32 | Ni, Pd, Ag | 40 | 30 | 85 | Ag | Cu2 | 300 |
| | 33 | Ni, Pd, Ag | 40 | 80 | 95 | Ag | Ni 1.0 | 450 |
| | 34 | Ni, Pd, Ag | 50 | 20 | 50 | Ag | Pd0.5 | 450 |
| | 35 | Ni, Pd, Ag | 40 | 30 | 65 | Ag | Pd2, Cu1 | 450 |
| COMPARISON EXAMPLE | 7 | — | — | — | 100 | Cu | — | 300 |
| | 8 | Ni, Pd, Cu | 8 | 7 | 88 | Cu | — | 600 |
| | 9 | — | — | — | 100 | Ag | — | 300 |
| | 10 | Ni, Pd, Ag | 8 | 7 | 108 | Ag | — | 550 |
| | 11 | Ni, Pd, Cu | 26 | 5 | 25 | Cu | — | 300 |

| | | | SAGGING LOOP | | WEDGE BONDING | PRESS-BONDED BALL | HIGH-TEMPERATURE |
|---|---|---|---|---|---|---|---|
| | | SNAKE LOOP | SPAN 3.5 mm | SPAN 5 mm | CHARACTERISTIC | SHAPE | RELIABILITY |
| EXAMPLE | 19 | ◎ | ◎ | ◎ | ◎ | ○ | ○ |
| | 20 | ◎ | ◎ | ◎ | ◎ | ◎ | ○ |
| | 21 | ◎ | ◎ | ◎ | ◎ | ◎ | ○ |
| | 22 | ◎ | ◎ | ◎ | Δ | ○ | ○ |
| | 23 | ◎ | ○ | ○ | ○ | ◎ | ○ |
| | 24 | ◎ | ◎ | ○ | ◎ | ◎ | ○ |
| | 25 | ◎ | ◎ | ◎ | ◎ | ◎ | ○ |
| | 26 | ◎ | ◎ | ◎ | ◎ | ◎ | ○ |
| | 27 | ◎ | ◎ | ◎ | ◎ | ○ | ◎ |
| | 28 | ◎ | ◎ | ◎ | ◎ | ○ | ◎ |
| | 29 | ◎ | ◎ | ◎ | ◎ | ○ | ◎ |
| | 30 | ◎ | ◎ | ◎ | ○ | ○ | ○ |

TABLE 2-continued

| | | | | | | | |
|---|---|---|---|---|---|---|---|
| | 31 | ◎ | ◎ | ◎ | ◎ | ○ | ○ |
| | 32 | ◎ | ◎ | ◎ | ◎ | ○ | ◎ |
| | 33 | ◎ | ◎ | ◎ | ◎ | ○ | ◎ |
| | 34 | ◎ | ◎ | ◎ | ◎ | ○ | ◎ |
| | 35 | ◎ | ◎ | ◎ | ◎ | ○ | ◎ |
| COMPAR-ISON EXAMPLE | 7 | X | X | X | Δ | Δ | X |
| | 8 | X | X | X | Δ | Δ | X |
| | 9 | X | X | X | Δ | Δ | X |
| | 10 | X | X | X | Δ | Δ | X |
| | 11 | ◎ | Δ | Δ | ○ | ○ | ○ |

The invention claimed is:

1. A bonding wire for a semiconductor device comprising:

a core material containing more than 50 mol % of a metal M;

an intermediate layer formed over a surface of the core material and made of nickel (Ni), palladium (Pd), the metal M, and unavoidable impurities, concentration of the Ni being 15 to 80 mol %; and a coating layer formed over the intermediate layer and made of Ni, Pd and unavoidable impurities, concentration of the Pd being 50 to 100 mol %, wherein the metal M is copper (Cu) or silver (Ag), and the concentration of the Ni in the coating layer is lower than concentration of the Ni in the intermediate layer.

2. The bonding wire according to claim 1, wherein a thickness of the intermediate layer is 8 to 80 nm.

3. The bonding wire according to claim 1, wherein the coating layer further contains gold (Au), and the bonding wire further comprises a surface layer formed over the coating layer and made of an alloy containing Au and Pd, concentration of the Au being 10 to 70 mol %, the sum total concentration of the Au and the Pd being 80 mol % or more, wherein the concentration of the Au in the coating layer is lower than the concentration of the Au in the surface layer.

4. The bonding wire according to claim 3, wherein a total thickness of the surface layer, the coating layer, and the intermediate layer is 25 to 200 nm.

5. The bonding wire according to claim 3, wherein a thickness of the surface layer is 3 to 30 nm.

6. The bonding wire according to claim 1, wherein: the metal M is Cu; the core material contains one or more elements selected from phosphorus (P), titanium (Ti), boron (B) and Ag; and a total concentration of the one or more elements contained in the bonding wire is in the range of 0.0005 to 0.02 mass %.

7. The bonding wire according to claim 1, wherein: the metal M is Cu; the core material contains one or more elements selected from Pd and Ni; and a total concentration of the one or more elements contained in the bonding wire is in the range of 0.2 to 2.0 mass %.

8. The bonding wire according to claim 1, wherein: the metal M is Ag; the core material contains one or more elements selected from Pd, Ni and Cu; and a total concentration of the one or more elements contained in the bonding wire is in the range of 0.5 to 5.0 mass %.

9. The bonding wire according to claim 1, wherein the coating layer further contains the same metal M as that contained in the core material.

* * * * *